United States Patent
Nakamura

(10) Patent No.: US 12,419,120 B2
(45) Date of Patent: Sep. 16, 2025

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Ryosuke Nakamura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 654 days.

(21) Appl. No.: 17/781,675

(22) PCT Filed: Dec. 8, 2020

(86) PCT No.: PCT/JP2020/045596
§ 371 (c)(1),
(2) Date: Jun. 1, 2022

(87) PCT Pub. No.: WO2021/124975
PCT Pub. Date: Jun. 24, 2021

(65) Prior Publication Data
US 2023/0005982 A1    Jan. 5, 2023

(30) Foreign Application Priority Data
Dec. 16, 2019   (JP) .................... 2019-226378

(51) Int. Cl.
*H10F 39/18* (2025.01)
*H10F 39/00* (2025.01)

(52) U.S. Cl.
CPC .......... *H10F 39/18* (2025.01); *H10F 39/802* (2025.01); *H10F 39/80373* (2025.01); *H10F 39/807* (2025.01)

(58) Field of Classification Search
CPC ............ H10F 39/199; H10F 39/80373; H10F 39/80–813
See application file for complete search history.

(56) References Cited

U.S. PATENT DOCUMENTS

2010/0308385 A1* 12/2010 Manda ................ H01L 27/1464
                                                    257/334
2013/0175582 A1    7/2013 Ihara et al.
(Continued)

FOREIGN PATENT DOCUMENTS

CN    101262003 A    9/2008
CN    104981906 A    10/2015
(Continued)

OTHER PUBLICATIONS

International Search Report and Written Opinion prepared by the Japan Patent Office on Feb. 18, 2021, for International Application No. PCT/JP2020/045596, 3 pgs.

*Primary Examiner* — Eric A. Ward
(74) *Attorney, Agent, or Firm* — Sheridan Ross PC

(57) ABSTRACT

A solid-state imaging device includes a transfer transistor and an element separation section. The transfer transistor includes a vertical gate electrode. At least a portion of the element separation section is disposed apart from the vertical gate electrode with a semiconductor layer interposed in between. The semiconductor layer has a high concentration of impurities of a first electrical conduction type. The element separation section includes an oxide film insulator.

7 Claims, 13 Drawing Sheets

(56) References Cited

U.S. PATENT DOCUMENTS

| | | | |
|---|---|---|---|
| 2013/0221410 A1 | 8/2013 | Ahn | |
| 2014/0312391 A1* | 10/2014 | Ihara | H01L 27/14614 |
| | | | 257/229 |
| 2015/0228684 A1 | 8/2015 | Yamashita | |
| 2015/0279899 A1 | 10/2015 | Kim et al. | |
| 2016/0079288 A1* | 3/2016 | Choi | H01L 27/14689 |
| | | | 438/57 |
| 2016/0365462 A1 | 12/2016 | Shoyama et al. | |
| 2019/0096933 A1 | 3/2019 | Kido et al. | |
| 2019/0252425 A1 | 8/2019 | Ogawa | |
| 2019/0348460 A1* | 11/2019 | Chen | H04N 25/772 |
| 2020/0111821 A1* | 4/2020 | Hong | H01L 27/1463 |

FOREIGN PATENT DOCUMENTS

| | | |
|---|---|---|
| CN | 105474394 A | 4/2016 |
| JP | 2010-283086 | 12/2010 |
| JP | 2015-153772 | 8/2015 |
| JP | 2017-076772 | 4/2017 |
| JP | 2018-148116 | 9/2018 |
| JP | 2019-140251 | 8/2019 |
| JP | 2019176089 A | 10/2019 |
| TW | 201532257 A | 8/2015 |
| TW | 201630173 A | 8/2016 |
| TW | 201843825 A | 12/2018 |
| WO | WO 2017/169754 | 10/2017 |
| WO | WO 2018/221261 | 12/2018 |
| WO | WO 2019/093479 | 5/2019 |

\* cited by examiner

SOLID-STATE IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2020/045596, having an international filing date of 8 Dec. 2020, which designated the United States, which PCT application claimed the benefit of Japanese Patent Application No. 2019-226378, filed 16 Dec. 2019, the entire disclosures of each of which are incorporated herein by reference.

TECHNICAL FIELD

The present disclosure relates to a solid-state imaging device and an electronic apparatus.

BACKGROUND ART

The solid-state imaging device has been used, for example, for an imaging device such as a digital still camera or a video camera or an electronic apparatus such as a portable terminal apparatus having an imaging function. As the solid-state imaging device, a CMOS (complementary MOS) image sensor has been known that reads out the electric charge accumulated in a photodiode which is a photoelectric conversion element through a MOS (Metal Oxide Semiconductor) transistor (see, for example, PTLs 1 to 3).

CITATION LIST

Patent Literature

PTL 1: International Publication No. WO 2018/221261
PTL 2: Japanese Unexamined Patent Application Publication No. 2010-283086
PTL 3: Japanese Unexamined Patent Application Publication No. 2018-148116

SUMMARY OF THE INVENTION

Incidentally, a solid-state imaging device is requested to suppress dark currents and have improved transfer characteristics. It is thus desirable to provide a solid-state imaging device that is able to achieve suppressed dark currents and improved transfer characteristics and an electronic apparatus including the solid-state imaging device.

A solid-state imaging device according to an embodiment of the present disclosure includes a semiconductor substrate including a light receiving surface and a plurality of sensor pixels disposed to be opposed to the light receiving surface. Each of the pixels includes a photoelectric conversion section, an electric charge holding section, a transfer transistor, an element separation section, and a semiconductor layer. The photoelectric conversion section photoelectrically converts light coming through the light receiving surface. The electric charge holding section is formed in a semiconductor region of a first electrical conduction type in the semiconductor substrate as a semiconductor region of a second electrical conduction type different from the first electrical conduction type. The electric charge holding section holds electric charge transferred from the photoelectric conversion section. The transfer transistor includes a vertical gate electrode and a gate insulating film in contact with the vertical gate electrode. The vertical gate electrode reaches the photoelectric conversion section. The gate insulating film is formed on a surface of the semiconductor substrate opposite to the light receiving surface. The transfer transistor transfers electric charge from the photoelectric conversion section to the electric charge holding section. The element separation section is formed close to the surface of the semiconductor substrate opposite to the light receiving surface. The element separation section includes an oxide film insulator. The semiconductor layer is in contact with a side surface and a bottom surface of the element separation section and the gate insulating film. The semiconductor layer has a higher concentration of impurities of the first electrical conduction type than a concentration of the semiconductor region. At least a portion of the element separation section is disposed apart from the vertical gate electrode with a portion of the semiconductor layer interposed in between. The portion of the semiconductor layer being in contact with the gate insulating film.

An electronic apparatus according to an embodiment of the present disclosure includes a solid-state imaging device and a signal processing circuit. The solid-state imaging device outputs a pixel signal corresponding to incident light. The signal processing circuit processes the pixel signal. The solid-state imaging device provided in the electronic apparatus has the same configuration as that of the solid-state imaging device described above.

The solid-state imaging device and the electronic apparatus according to the respective embodiments of the present disclosure are each provided with the transfer transistor including the vertical gate electrode and have at least a portion of the element separation section disposed apart from the vertical gate electrode with the semiconductor layer interposed in between. The element separation section includes the oxide film insulator. The semiconductor layer has a high concentration of impurities of the first electrical conduction type. This makes it possible to improve the transfer characteristics while suppressing dark currents even in a case where the element separation section is brought closer to the vertical gate electrode.

MODES FOR CARRYING OUT THE INVENTION

Figure 1:
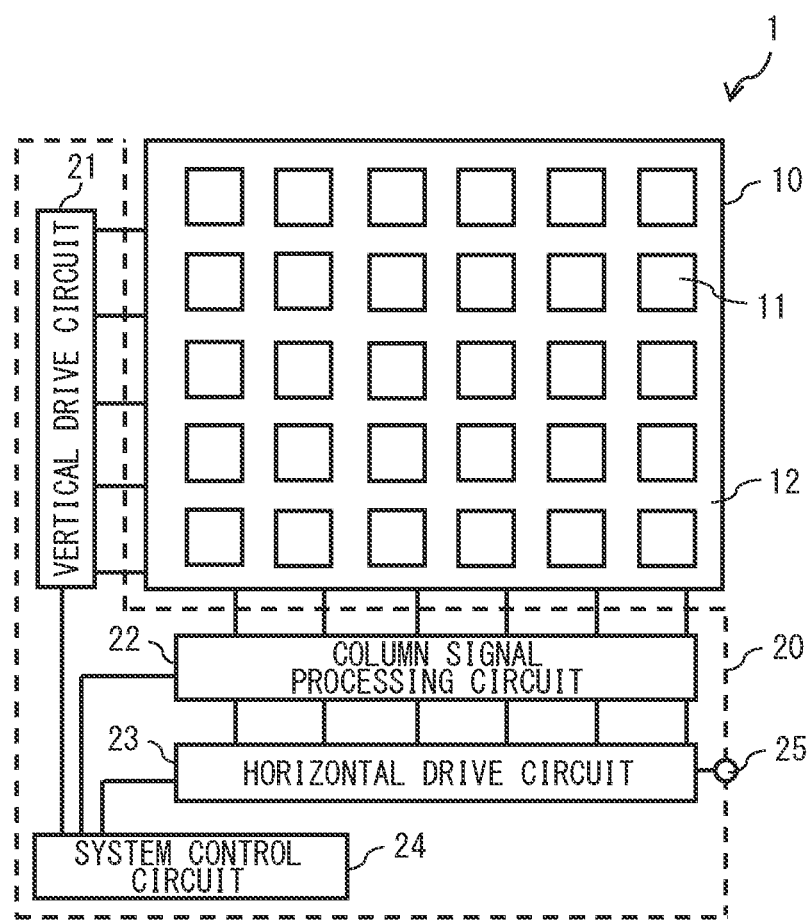
FIG. 1 is a diagram illustrating an example of a schematic configuration of a solid-state imaging device according to an embodiment of the present disclosure.

The following describes a preferred embodiment of the present disclosure in detail with reference to the accompanying drawings. It is to be noted that, in this description and the drawings, components that have substantially the same functional configuration are indicated by the same signs and redundant description thereof is thus omitted.

In addition, in this specification and the drawings, a plurality of components having substantially the same or similar functional configuration is distinguished by adding different numbers to the ends of the same reference signs in some cases. The same reference sign alone is, however, assigned to a plurality of components having substantially the same or similar functional configuration in a case where there is no need to particularly distinguish them. In addition, similar components according to different embodiments are distinguished by attaching different alphabets to the same reference signs in some cases. However, in a case where there is no need to particularly distinguish similar components from each other, the same reference signs alone are attached.

In addition, the drawings to be referred to in the following description are intended to describe an embodiment of the present disclosure and promote an understanding thereof and shapes, dimensions, ratios, and the like illustrated in the drawings are different from reality for better understanding in some cases. Further, it is possible to change the design of a solid-state imaging element illustrated in the drawings as appropriate by taking into consideration the following description and the known technology. In addition, in description using a cross-sectional view of the solid-state imaging element, the up/down direction of the stacked structure of the solid-state imaging element corresponds to a relative direction in a case where an incidence surface of the solid-state imaging element that light enters is used as a top surface. The up/down direction is different from an up/down direction that is compliant with the actual gravitational acceleration in some cases.

In addition, in the following description, expressions regarding a size and a shape do not mean only the same values as a numerical value defined mathematically and a shape defined geometrically, but include, for example, a shape having an industrially acceptable difference in a step of manufacturing the solid-state imaging element and even a shape similar to the shape.

Further, in the following description of circuit configurations, unless otherwise specified, "coupling" refers to electrical coupling between a plurality of elements. In addition, "coupling" in the following description includes not only coupling a plurality of elements directly and electrically, but also coupling a plurality of elements indirectly and electrically through another element.

It is to be noted that description is given in the following order.

Figure 2:
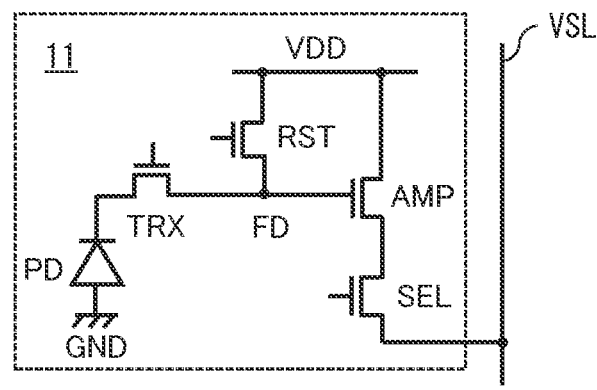
FIG. 2 is a diagram illustrating an example of a circuit configuration of a sensor pixel in FIG. 1.
Figure 3:
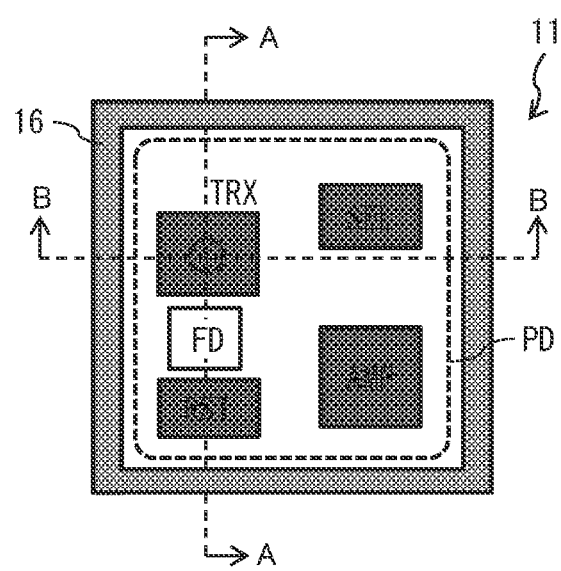
FIG. 3 is a diagram illustrating an example of a planar configuration of the sensor pixel in FIG. 1.
Figure 4:
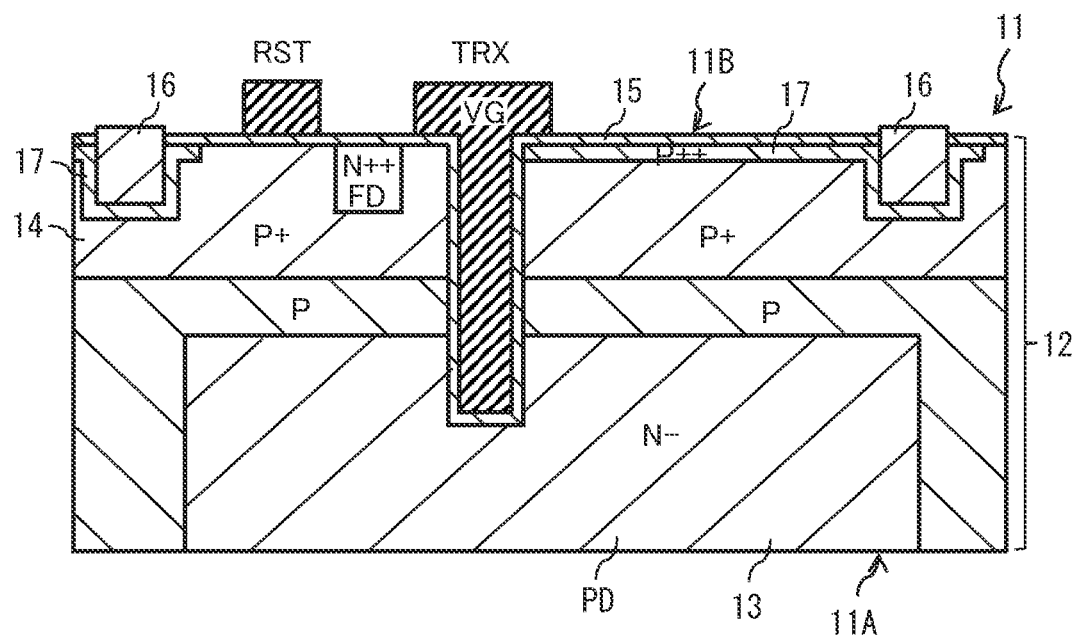
FIG. 4 is a diagram illustrating an example of a cross-sectional configuration of the sensor pixel in FIG. 3 taken along an A-A line.
Figure 15:
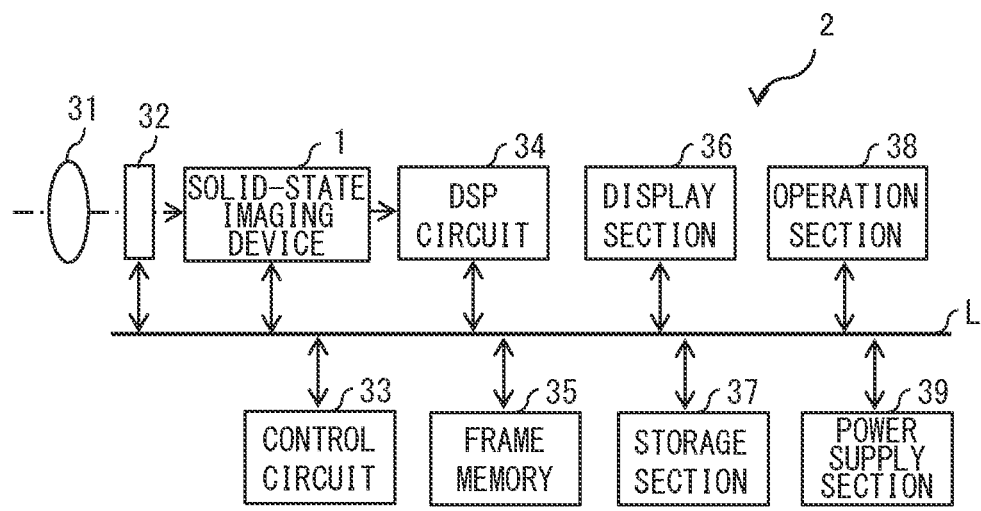
FIG. 15 is a diagram illustrating an example of a schematic configuration of an imaging system including the imaging device according to any of the embodiment described above and the modification examples thereof.
Figure 16:
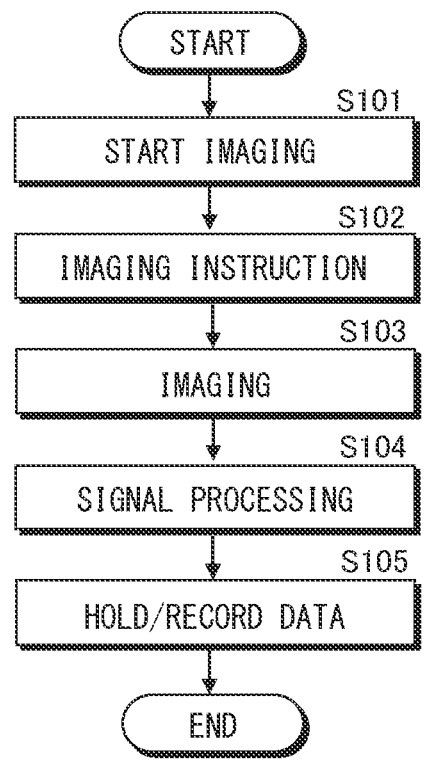
FIG. 16 is a diagram illustrating an example of an imaging procedure of the imaging system in FIG. 15.
Figure 17:
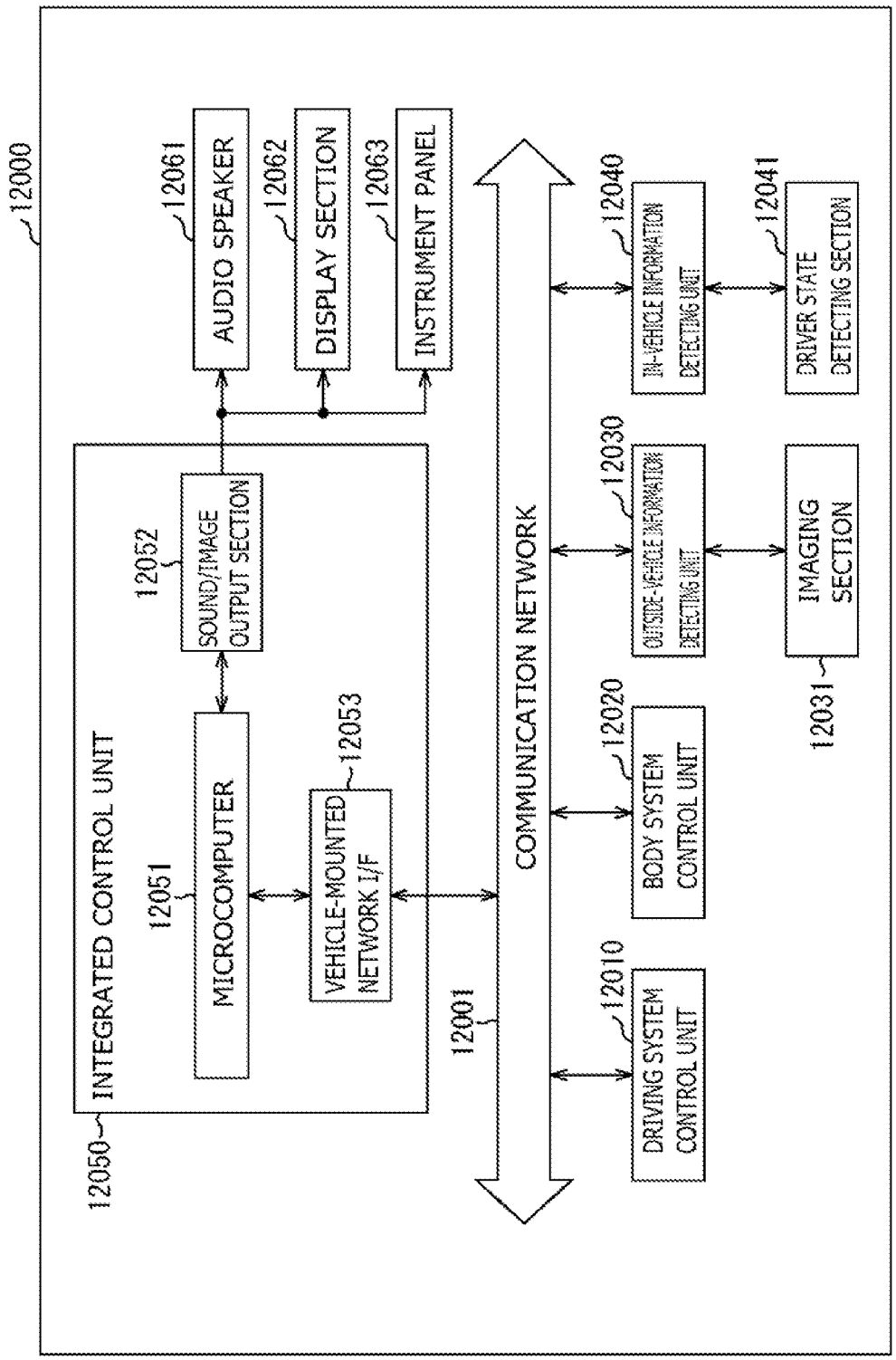
FIG. 17 is a block diagram depicting an example of schematic configuration of a vehicle control system.
Figure 18:
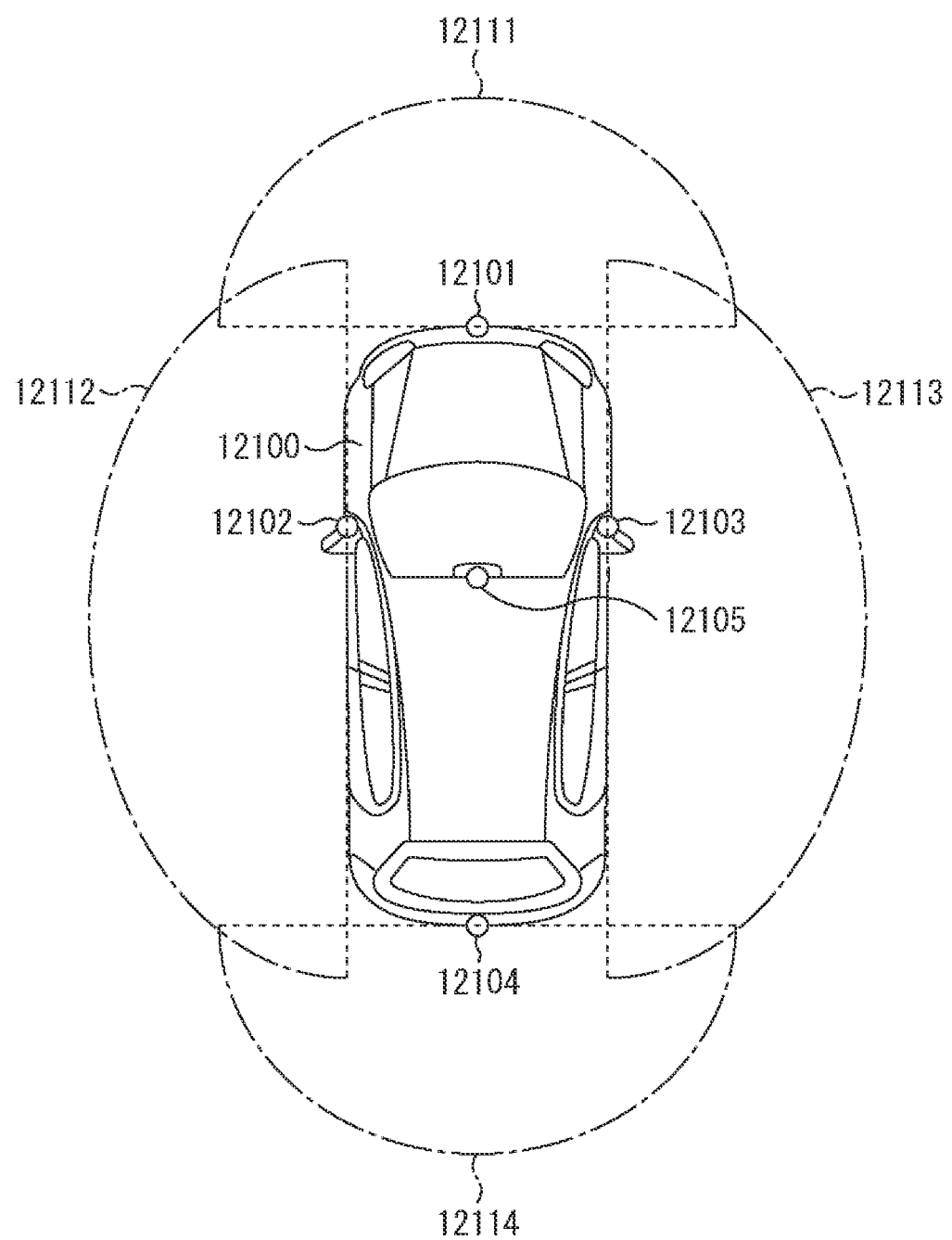
FIG. 18 is a diagram of assistance in explaining an example of installation positions of an outside-vehicle information detecting section and an imaging section.
Figure 19:
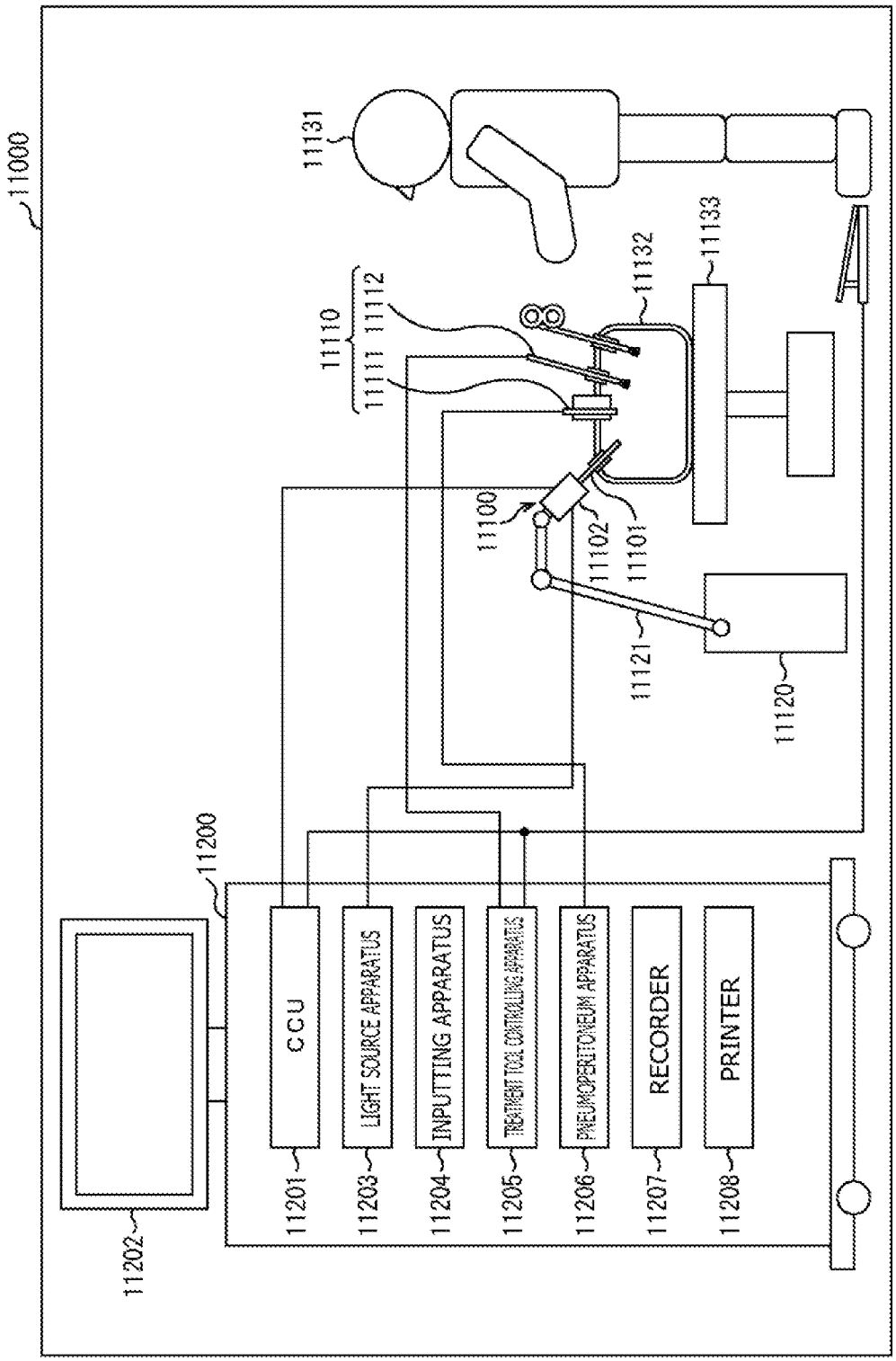
FIG. 19 is a view depicting an example of a schematic configuration of an endoscopic surgery system.
Figure 20:
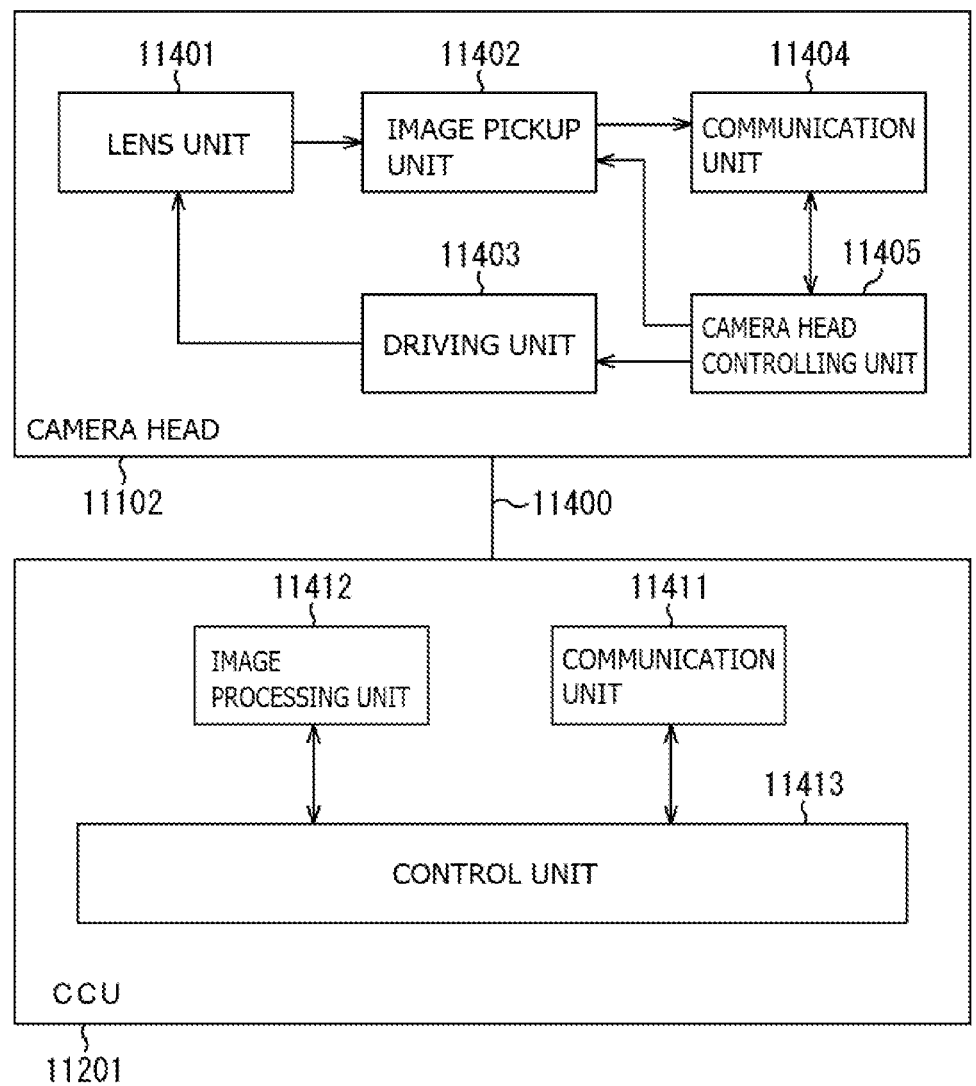
FIG. 20 is a block diagram depicting an example of a functional configuration of a camera head and a camera control unit (CCU).

1. Embodiment (solid-state imaging device) . . . FIGS. 1 to 5
2. Modification Examples (solid-state imaging device) . . . FIGS. 6 to 14
3. Application Example (Imaging System) . . . FIGS. 15 and 16
4. Practical Application Examples
Example of Practical Application to Mobile Body . . . FIGS. 17 and 18
Example of Practical Application to Endoscopic Surgery System . . . FIGS. 19 and 20

1. Embodiment

[Configuration]

FIG. 1 illustrates an example of a schematic configuration of a solid-state imaging device 1 according to an embodiment of the present disclosure. The solid-state imaging device 1 includes a pixel array section 10 in which a plurality of pixels 11 is disposed in a matrix. The pixel array section 10 has a configuration in which the plurality of pixels 11 is stacked on a semiconductor substrate 12 including, for example, silicon. The plurality of sensor pixels 11 is disposed in a matrix at positions opposed to a light receiving surface 11A that is the back surface of the semiconductor substrate 12. In other words, the pixel array section 10 includes the semiconductor substrate 12 including the light receiving surface 11A and the plurality of sensor pixels 11 disposed to be opposed to the light receiving surface 11A.

The pixel array section 10 further includes a plurality of pixel drive lines and a plurality of vertical signal lines VSL on the semiconductor substrate 12 including, for example, silicon. Each of the pixel drive lines is a wiring line to which a control signal is applied that controls the output of the electric charge accumulated in the sensor pixel 11. The pixel drive line extends, for example, in the row direction. Each of the vertical signal lines VSL is a wiring line that outputs a pixel signal outputted from each of the sensor pixels 11 to a logic circuit 20. The vertical signal line VSL extends, for example, in the column direction. The logic circuit 20 is provided, for example, on the semiconductor substrate 12 and around the pixel array section 10. The logic circuit 20 may be provided on a semiconductor substrate or a semiconductor layer formed on the semiconductor substrate 12.

The logic circuit 20 includes, for example, a vertical drive circuit 21, a column signal processing circuit 22, a horizontal drive circuit 23, a system control circuit 24, an output circuit 25, and the like. The following describes the respective blocks of the solid-state imaging device 1 according to the present embodiment in detail.

(Vertical Drive Circuit 21)

The vertical drive circuit 21 includes, for example, a shift register. The vertical drive circuit 21 selects a pixel drive line 42, supplies the selected pixel drive line 42 with pulses for driving the sensor pixels 11, and drives the sensor pixels 11 by the predetermined unit pixel row. The vertical drive circuit 21 selectively scans the respective sensor pixels 11 in the pixel array section 10 sequentially in the vertical direction (up/down direction in FIG. 1) by the predetermined unit pixel row. The vertical drive circuit 21 supplies a pixel signal based on the electric charge generated in accordance with the amount of light received by a photodiode PD of each of the sensor pixels 11 to the column signal processing circuit 22 through the vertical signal line VSL.

(Column Signal Processing Circuit 22)

The column signal processing circuit 22 is disposed for each column of the sensor pixels 11 and performs signal processing such as noise removal for each pixel column on the pixel signals outputted from the sensor pixels 11 for the predetermined unit pixel row. The column signal processing circuit 22 performs a correlated double sampling (Correlated Double Sampling: CDS) process, for example, to remove pixel-specific fixed pattern noise. The column signal processing circuit 22 includes, for example, a single-slope A/D converter. The single-slope A/D converter includes, for example, a comparator and a counter circuit and performs AD (Analog-Degital) conversion on a pixel signal.

(Horizontal Drive Circuit 23)

The horizontal drive circuit 23 includes, for example, a shift register. The horizontal drive circuit 23 sequentially outputs horizontal scanning pulses to sequentially select the respective column signal processing circuits 22 described above and outputs the pixel signal from each of the column signal processing circuits 22 to the horizontal signal line.

(Output Circuit 25)

The output circuit 25 performs signal processing on the pixel signals sequentially supplied from the respective column signal processing circuits 22 through the horizontal signal lines and outputs the resultant pixel signals. The output circuit 25 may function, for example, as a functional section that performs buffering (buffering) and may perform processes such as black level adjustment, column variation correction, and various types of digital signal processing. The buffering means temporarily storing pixel signals to compensate for differences in processing speed and transfer speed in exchanging the pixel signals.

(System Control Circuit 24)

The system control circuit 24 receives an input clock and data for issuing an instruction about an operation mode or the like. In addition, the system control circuit 24 outputs data such as internal information of the sensor pixel 11. On the basis of a vertical synchronization signal, a horizontal synchronization signal, and a master clock, the system control circuit 24 generates a clock signal and a control signal serving as a reference for operations of the vertical drive circuit 21, the column signal processing circuit 22, the horizontal drive circuit 23, and the like. The system control circuit 24 outputs the generated clock signal and the generated control signal to the vertical drive circuit 21, the column signal processing circuit 22, the horizontal drive circuit 23, and the like.

A planar configuration example of the solid-state imaging device 1 according to the present embodiment is not limited to the example illustrated in FIG. 1, but may include, for example, another circuit or the like.

(Sensor Pixel 11)

Next, a circuit configuration of the sensor pixel 11 is described. FIG. 2 illustrates an example of a circuit configuration of the sensor pixel 11. As described above, the pixel array section 10 includes the plurality of sensor pixels 11. Each of the sensor pixels 11 includes, for example, the photodiode PD and a pixel circuit. The photodiode PD photoelectrically converts light coming through the light receiving surface 11A. The photodiode PD corresponds to a specific example of a "photoelectric conversion section" according to the present disclosure. The pixel circuit generates a pixel signal, for example, based on the electric charge outputted from the photodiode PD and outputs the pixel signal to the vertical signal line VSL. The pixel circuit includes a plurality of pixel transistors. The pixel circuit includes, for example, a transfer transistor TRX, a selection transistor SEL, a reset transistor RST, an amplification transistor AMP, and the like. The pixel transistors are, for example, MOS (Metal-Oxide-Semiconductor) transistors. The pixel circuit further includes a floating diffusion FD. The transfer transistor TRX corresponds to a specific example of a "transfer transistor" according to the present disclosure. The floating diffusion FD corresponds to a specific example of an "electric charge holding section" according to the present disclosure.

The transfer transistor TRX is coupled between the photodiode PD and the floating diffusion FD and transfers the electric charge accumulated in the photodiode PD to the floating diffusion FD from the photodiode PD in accordance with a control signal applied to the gate electrode. The transfer transistor TRX transfers the electric charge from the photodiode PD to the floating diffusion FD. The drain of the transfer transistor TRG is electrically coupled to the floating diffusion FD and the gate of the transfer transistor TRX is coupled to the pixel drive line.

The floating diffusion FD is a floating diffusion region that temporarily holds the electric charge transferred from the photodiode PD through the transfer transistor TRX. For example, the reset transistor RST is coupled to the floating diffusion FD and the vertical signal line VSL is also coupled to the floating diffusion FD through the amplification transistor AMP and the selection transistor SEL.

The reset transistor RST has the drain coupled to a power supply line VDD and has the source coupled to the floating diffusion FD. The reset transistor RST initializes (resets) the floating diffusion FD in accordance with a control signal applied to the gate electrode. For example, in a case where the reset transistor RST is turned on, the potential of the floating diffusion FD is reset to the potential level of the power supply line VDD. In other words, the floating diffusion FD is initialized.

The amplification transistor AMP has the gate electrode coupled to the floating diffusion FD and has the drain coupled to the power supply line VDD. The amplification transistor AMP serves as an input section of a source follower circuit that reads electric charge obtained through photoelectric conversion in the photodiode PD. In other words, the amplification transistor AMP has the source coupled to the vertical signal line VSL through the selection transistor SEL, thereby providing the source follower circuit together with a constant current source coupled to an end of the vertical signal line VSL.

The selection transistor SEL is coupled between the source of the amplification transistor AMP and the vertical signal line VSL. The gate electrode of the selection transistor SEL is supplied with a control signal as a selection signal. In a case where the control signal is turned on, the selection transistor SEL is brought into a conduction state and the sensor pixel 11 linked to the selection transistor SEL is brought into a selected state. In a case where the sensor pixel 11 is brought into the selected state, a pixel signal outputted from the amplification transistor AMP is read out by the column signal processing circuit 22 through the vertical signal line VSL.

Figure 5:
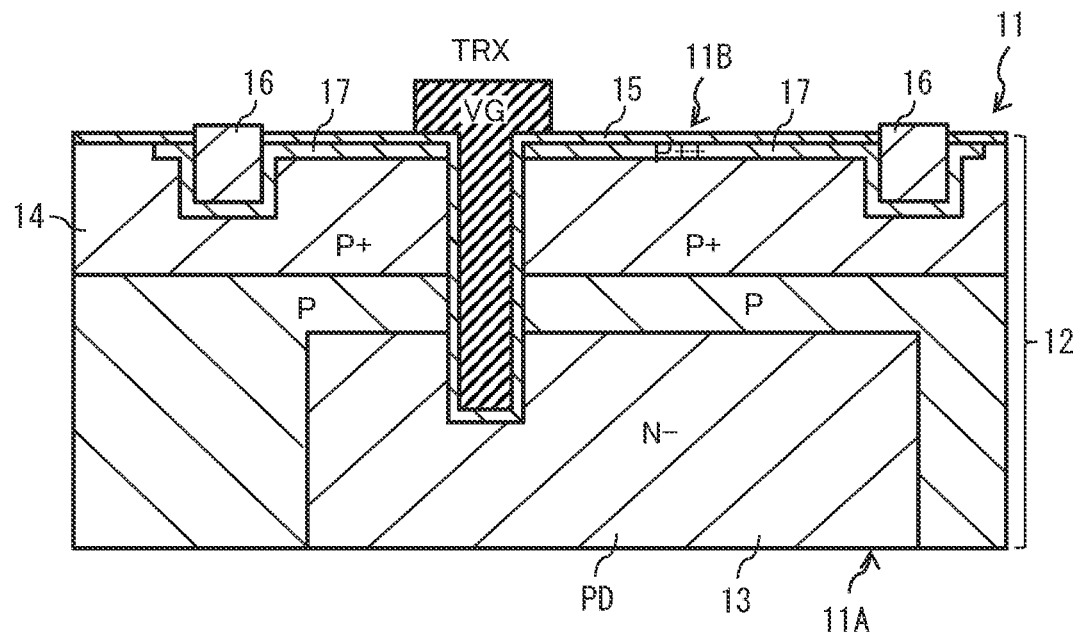
FIG. 5 is a diagram illustrating an example of a cross-sectional configuration of the sensor pixel in FIG. 3 taken along a B-B line.

Next, a structure of the sensor pixel 11 is described. FIG. 3 illustrates an example of a planar configuration of the sensor pixel 11. FIG. 4 illustrates an example of a cross-sectional configuration of the sensor pixel 11 taken along the A-A line in FIG. 3. FIG. 5 illustrates an example of a cross-sectional configuration of the sensor pixel 11 taken along the B-B line in FIG. 3.

A pixel circuit including, for example, the transfer transistor TRX or the like is formed on the upper surface of the semiconductor substrate 12. Therefore, the upper surface of the semiconductor substrate 12 serves as a formation surface 11B for the transfer transistor TRX or the like. It is to be noted that a portion (e.g., the selection transistor SEL, the amplification transistor, and the reset transistor RST) of the pixel circuit may be formed in a semiconductor substrate or a semiconductor layer formed on the upper surface (formation surface 11B) side of the semiconductor substrate 12. A wiring layer including, for example, a wiring line or the like in the pixel circuit is formed on the upper surface (formation surface 11B) of the semiconductor substrate 12 in contact.

The semiconductor substrate 12 includes, for example, a silicon substrate. The semiconductor substrate 12 includes a semiconductor region (well layer 14) of a first electrical conduction type (e.g., P type) on a portion of the upper surface (formation surface 11B) and near there. The semiconductor substrate 12 includes, in a region deeper than the well layer 14, a semiconductor region having a lower concentration of impurities of the first electrical conduction type (e.g., P type) than that of the well layer 14.

The semiconductor substrate 12 includes a semiconductor region 13 of a second electrical conduction type (e.g., N type) different from the first electrical conduction type (e.g., P type) in the semiconductor region having a lower concentration of impurities of the first electrical conduction type (e.g., P type) than that of the well layer 14. The photodiode PD is formed by a PN junction of the semiconductor region 13 and a semiconductor region having the first electrical conductivity type (e.g., P type) that is adjacent to the semiconductor region 13. The photodiode PD photoelectrically converts light coming through the light receiving surface 11A that is the back surface of the semiconductor substrate 12. The photodiode PD performs photoelectric conversion to generate the electric charge corresponding to the amount of received light. The cathode of the photodiode PD is electrically coupled to a source of the transfer transistor TRG and the anode of the photodiode PD is electrically coupled to a reference potential line (e.g., ground GND).

The semiconductor substrate 12 includes an insulating film 15 on a portion of the upper surface (formation surface 11B). The insulating film 15 is used as a gate oxide film of the transfer transistor TRX. The insulating film 15 is, for example, a silicon oxide film formed by performing thermal oxidation or the like on a surface of a silicon substrate. The semiconductor substrate 12 includes a semiconductor layer 17 in a layer between the well layer 14 and the insulating film 15 near the upper surface (formation surface 11B). The semiconductor layer 17 has a higher concentration of impurities of the first electrical conduction type (e.g., P type) than that of the well layer 14. The semiconductor layer 17 corresponds to a specific example of a "semiconductor layer" according to the present disclosure. The semiconductor layer 17 is formed in contact with the insulating film 15 and the well layer 14. The semiconductor layer 17 is also formed in contact with the side surface and the bottom surface of an element separation section 16 described below.

The transfer transistor TRX includes a vertical gate electrode VG as a gate electrode. A portion of the vertical gate electrode VG other than the upper end section (umbrella-shaped portion) is formed in the semiconductor substrate 12 to extend in the thickness direction of the semiconductor substrate 12. The lower end section of the vertical gate electrode VG is formed, for example, deep sufficient to reach the photodiode PD. The upper end section of the vertical gate electrode VG is formed in contact with the upper surface of the semiconductor substrate 12. The vertical gate electrode VG is formed by filling, for example, a trench provided in the semiconductor substrate 12 and having the inner wall covered with the insulating film 15, for example, with a metal material or an electrically conductive material such as polysilicon. The insulating film 15 in the trench is formed, for example, by performing thermal oxidation or the like on the inner wall of the trench provided in the semiconductor substrate 12. The trench is filled with an electrically conductive material, for example, by CVD (Chemical Vapor Deposition) or the like.

The transfer transistor TRX includes an insulating film 15 as a gate oxide film. The insulating film 15 corresponds to a specific example of a "gate oxide film" according to the present disclosure. The insulating film 15 is formed on the upper surface (the surface (formation surface 11B) opposite to the light receiving surface 11A) of the semiconductor substrate 12. The insulating film 15 is formed in contact with a portion of the vertical gate electrode VG other than the upper end section (umbrella-shaped portion).

The floating diffusion FD is disposed, for example, apart from a portion of the vertical gate electrode VG other than the upper end section (umbrella-shaped portion). The floating diffusion FD may be disposed apart from the vertical gate electrode VG as viewed from the normal direction of the semiconductor substrate 12. There may be provided, around the floating diffusion FD, a semiconductor region having a lower concentration of impurities of the second electrical conduction type (e.g., N type) than the concentration of the floating diffusion FD. In this case, this semiconductor region may be disposed at a position at which at least a portion of this semiconductor region overlaps with the vertical gate electrode VG as viewed from the normal direction of the semiconductor substrate 12.

Each of the sensor pixels 11 includes the element separation section 16 on the upper surface (formation surface 11B) of the semiconductor substrate 12. The element separation section 16 corresponds to a specific example of an "element separation section" according to the present disclosure. The element separation section 16 is formed close to the surface (formation surface 11B) of the semiconductor substrate 12 opposite to the light receiving surface 11A. The element separation section 16 electrically separates the two sensor pixels 11 adjacent to each other on the upper surface (formation surface 11B) of the semiconductor substrate 12 and near there. The lower end of the element separation section 16 is provided, for example, deep insufficient to reach the formation depth of the photodiode PD in the semiconductor substrate 12. At least a portion of the element separation section 16 is disposed apart from a portion of the vertical gate electrode VG other than the upper end section (umbrella-shaped portion) with the semiconductor layer 17 interposed in between. At least a portion of the element separation section 16 is disposed apart from a portion of the vertical gate electrode VG other than the upper end section (umbrella-shaped portion) with a portion of the semiconductor layer 17 interposed in between. The portion of the semiconductor layer 17 is in contact with the insulating film 15.

The semiconductor layer 17 is formed near the upper surface (formation surface 11B) of the semiconductor substrate 12. The semiconductor layer 17 is formed in contact with the side surface and the bottom surface of the element separation section 16. Further, the semiconductor layer 17 extends from the element separation section 16 side toward the vertical gate electrode VG near the upper surface (formation surface 11B) of the semiconductor substrate 12. The semiconductor layer 17 is disposed at a position at which a portion of the semiconductor layer 17 overlaps with the vertical gate electrode VG as viewed from the normal direction of the semiconductor substrate 12.

At least a portion of the element separation section 16 may be disposed apart from the vertical gate electrode VG as viewed from the normal direction of the semiconductor substrate 12. Any portion of the element separation section 16 may be disposed apart from the vertical gate electrode VG as viewed from the normal direction of the semiconductor substrate 12. The element separation section 16 includes, for example, an oxide film insulator such as STI (Shallow Trench Isolation). The STI is formed, for example, by filling a trench formed in the semiconductor substrate 12 with silicon oxide by CVD or the like.

Each of the sensor pixels 11 may have a color filter and a light receiving lens on the back surface (light receiving surface 11A) side of the semiconductor substrate 12. In this case, the solid-state imaging device 1 includes a plurality of light receiving lenses each of which is provided for the sensor pixel 11. The plurality of light receiving lenses is each provided for the photodiode PD. The plurality of light receiving lenses is disposed at positions opposed to the photodiodes PD. Each of the light receiving lenses is provided, for example, in contact with the color filter and is provided at a position opposed to the photodiode PD with the color filter interposed in between.

Each of the sensor pixels 11 may include an element separation section that electrically and optically separates the two photodiodes PD adjacent to each other. In this case, the element separation section is formed to extend in the normal direction (thickness direction) of the semiconductor substrate 12. For example, the element separation section is formed to penetrate the semiconductor substrate 12. The element separation section includes, for example, a DTI (Deep Trench Isolation) structure. The DTI includes, for example, an insulating film in contact with the inner wall of a trench provided from the back surface (light receiving surface 11A) side of the semiconductor substrate 12 and a metal-buried section provided inside the insulating film. The insulating film is, for example, an oxide film formed by thermally oxidizing the semiconductor substrate 12 and includes, for example, silicon oxide. The metal-buried section is formed by using, for example, a substitution phenomenon through heat treatment and is formed by using, for example, aluminum or aluminum alloy.

[Effects]

Next, effects of the solid-state imaging device 1 according to the present embodiment are described.

Figure 6:
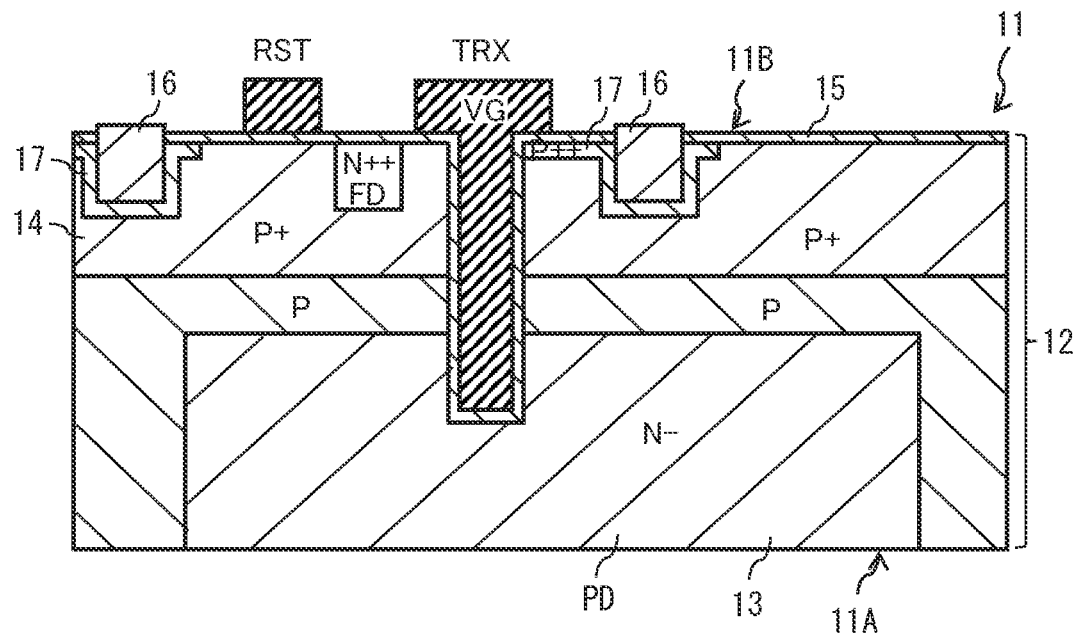
FIG. 6 is a diagram illustrating a modification example of the cross-sectional configuration of the sensor pixel in FIG. 4.
Figure 7:
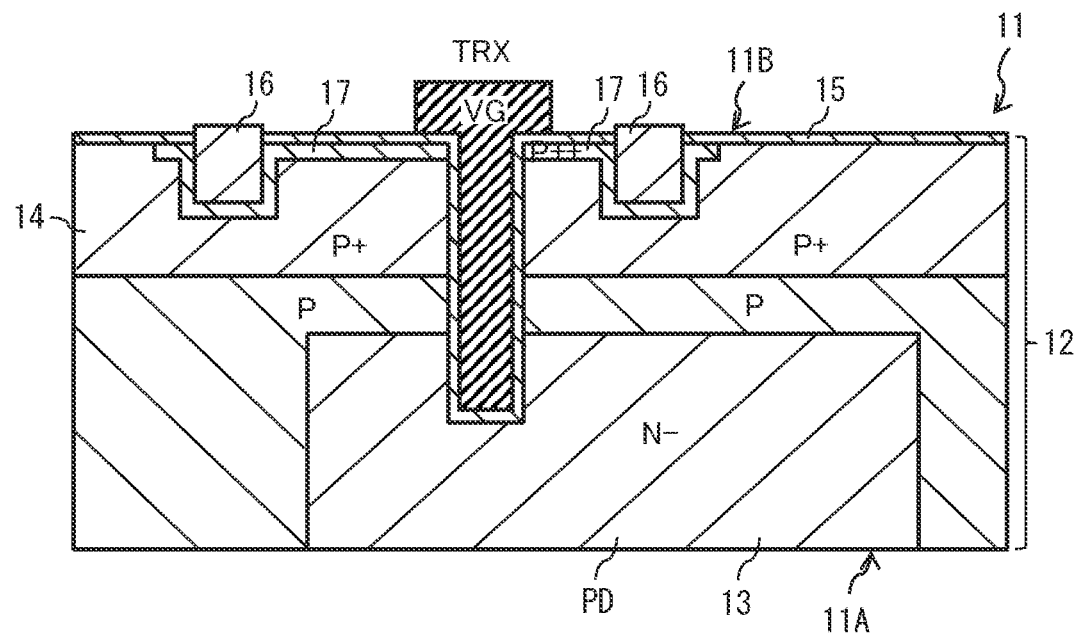
FIG. 7 is a diagram illustrating a modification example of the cross-sectional configuration of the sensor pixel in FIG. 5.

In the present embodiment, the vertical transistor (transfer transistor TRX) is provided that includes the vertical gate electrode VG. At least a portion of the element separation section 16 is disposed apart from a portion of the vertical gate electrode VG other than the upper end section (umbrella-shaped portion) with the semiconductor layer 17 interposed in between. This makes it possible to improve the transfer characteristics while suppressing dark currents even in a case where the element separation section 16 is brought closer to the vertical gate electrode VG, for example, as illustrated in FIGS. 6 and 7.

In the present embodiment, the semiconductor layer 17 is provided between at least a portion of the element separation section 16 and the vertical gate electrode VG. Further, any portion of the element separation section 16 is disposed apart from the vertical gate electrode VG as viewed from the normal direction of the semiconductor substrate 12. This makes it possible to improve the transfer characteristics while suppressing dark currents as compared with a case where the semiconductor layer 17 is not provided between the element separation section 16 and the vertical gate electrode VG.

2. Modification Examples

The following describes modification examples of the solid-state imaging device 1 according to the embodiment described above.

Modification Example A

Figure 8:
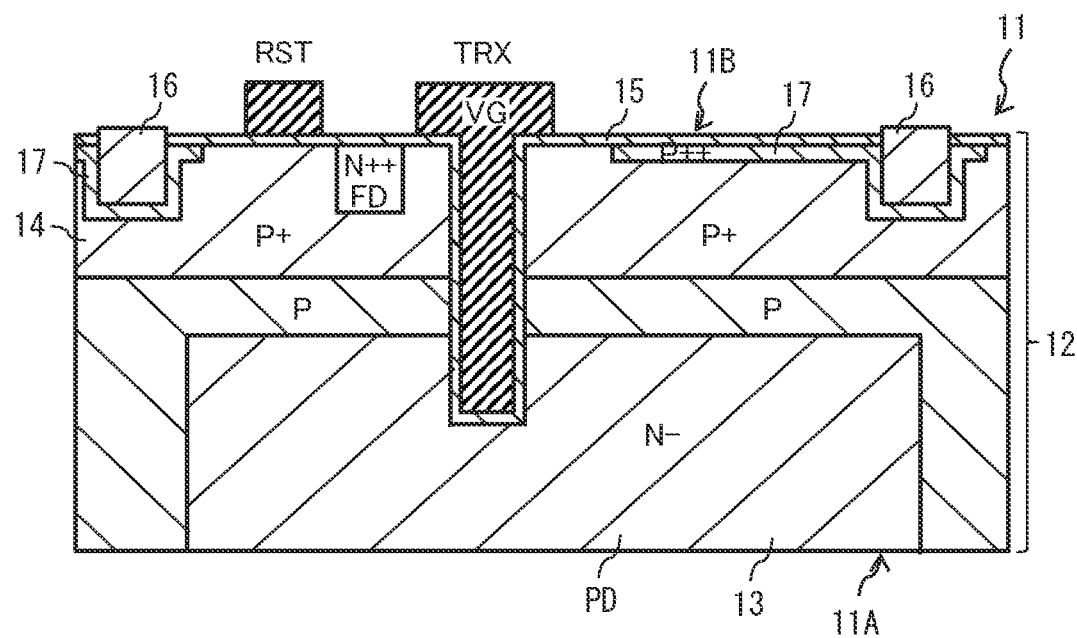
FIG. 8 is a diagram illustrating a modification example of the cross-sectional configuration of the sensor pixel in FIG. 4.
Figure 9:
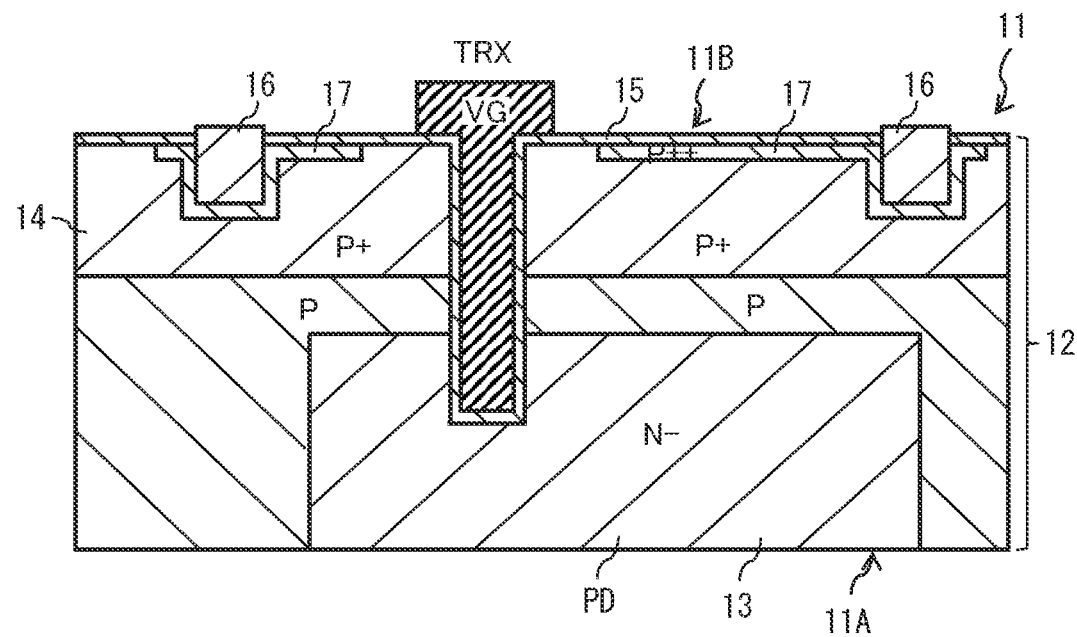
FIG. 9 is a diagram illustrating a modification example of the cross-sectional configuration of the sensor pixel in FIG. 5.

In the embodiment described above, a portion of the semiconductor layer 17 overlaps with the vertical gate electrode VG as viewed from the normal direction of the semiconductor substrate 12. However, in the embodiment described above, for example, as illustrated in FIGS. 8 and 9, the semiconductor layer 17 may be disposed apart from the vertical gate electrode VG as viewed from the normal direction of the semiconductor substrate 12. FIG. 8 illustrates a modification example of the cross-sectional configuration of the sensor pixel 11 taken along the A-A line in FIG. 3. FIG. 9 illustrates a modification example of the cross-sectional configuration of the sensor pixel 11 taken along the B-B line in FIG. 3. Even in such a case, it is possible to achieve suppressed dark currents and improved transfer characteristics as in the embodiment described above.

Modification Example B

Figure 10:
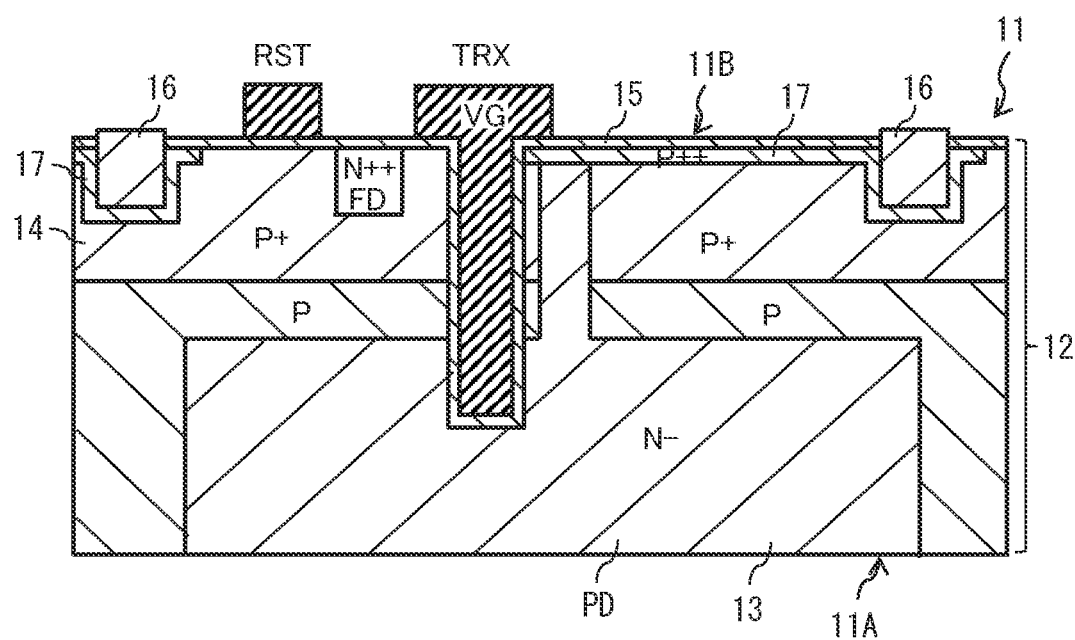
FIG. 10 is a diagram illustrating a modification example of the cross-sectional configuration of the sensor pixel in FIG. 4.
Figure 11:
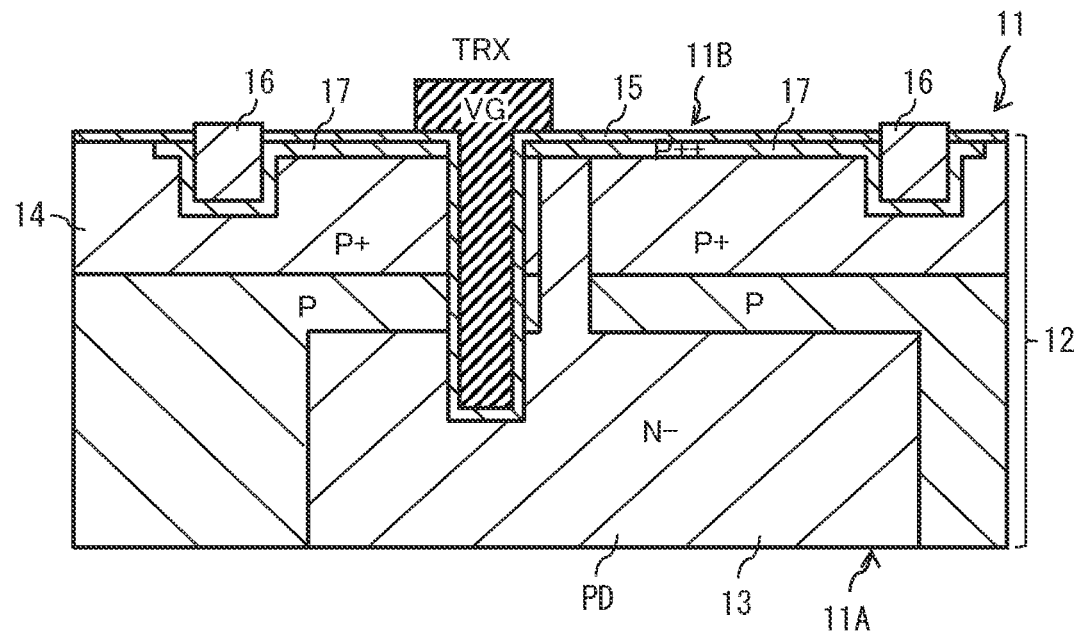
FIG. 11 is a diagram illustrating a modification example of the cross-sectional configuration of the sensor pixel in FIG. 5.

In the embodiment described above and the modification example thereof, the photodiode PD is formed at a position deeper than the well layer 14 in the semiconductor substrate 12. However, in the embodiment described above and the modification example thereof, for example, as illustrated in FIGS. 10 and 11, a portion of the photodiode PD may be formed in a transfer path of electric charge in the transfer transistor TRX. FIG. 10 illustrates a modification example of the cross-sectional configuration of the sensor pixel 11 taken along the A-A line in FIG. 3. FIG. 11 illustrates a modification example of the cross-sectional configuration of the sensor pixel 11 taken along the B-B line in FIG. 3. In this case, a portion of the photodiode PD extends along the vertical gate electrode VG toward the upper surface (formation surface 11B) of the semiconductor substrate 12. In such a case, it is possible to achieve improved transfer characteristics.

Modification Example C

Figure 12:
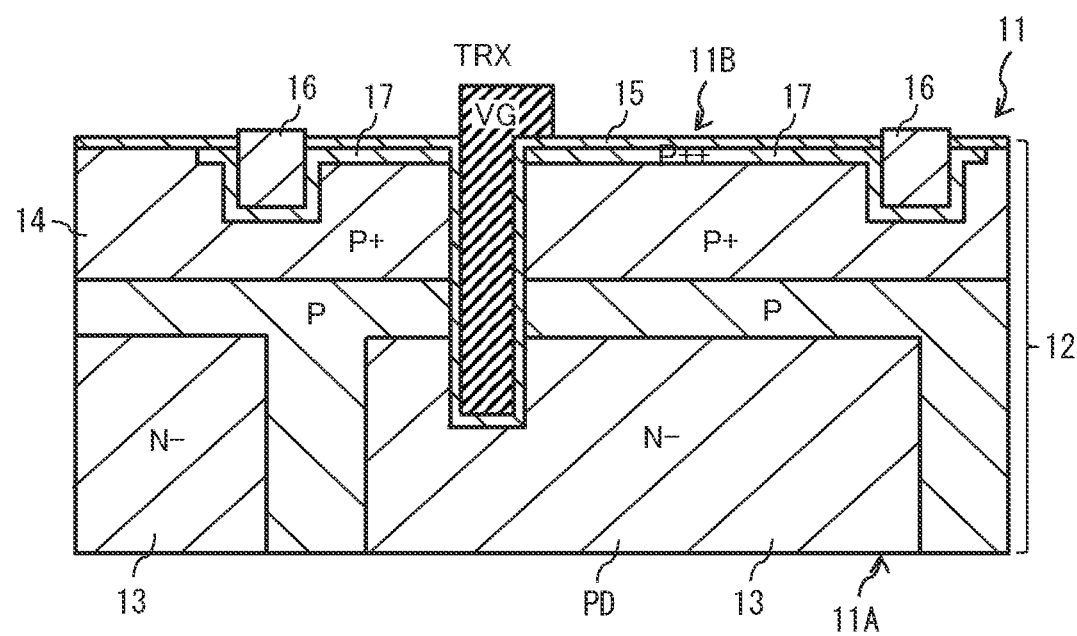
FIG. 12 is a diagram illustrating a modification example of the cross-sectional configuration of the sensor pixel in FIG. 5.

In the embodiment described above and the modification examples thereof, the upper end section of the vertical gate electrode VG has an umbrella shape. However, in the embodiment described above and the modification examples thereof, for example, as illustrated in FIG. 12, a portion of the upper end section of the vertical gate electrode VG may be omitted that corresponds to a portion of the transfer gate which is not a transfer path. In this case, the upper end section of the vertical gate electrode VG in the stacked in-plane direction has all the smaller dimensions for the omission. In such a case, it is possible to bring the element separation section 16 all the closer to the vertical gate electrode VG for a reduction in the dimensions of the upper end section of the vertical gate electrode VG in the stacked in-plane direction. As a result, it is possible to reduce the pixel size of the sensor pixel 11 all the more for a reduction in the dimensions of the upper end section of the vertical gate electrode VG in the stacked in-plane direction.

Modification Example D

Figure 13:
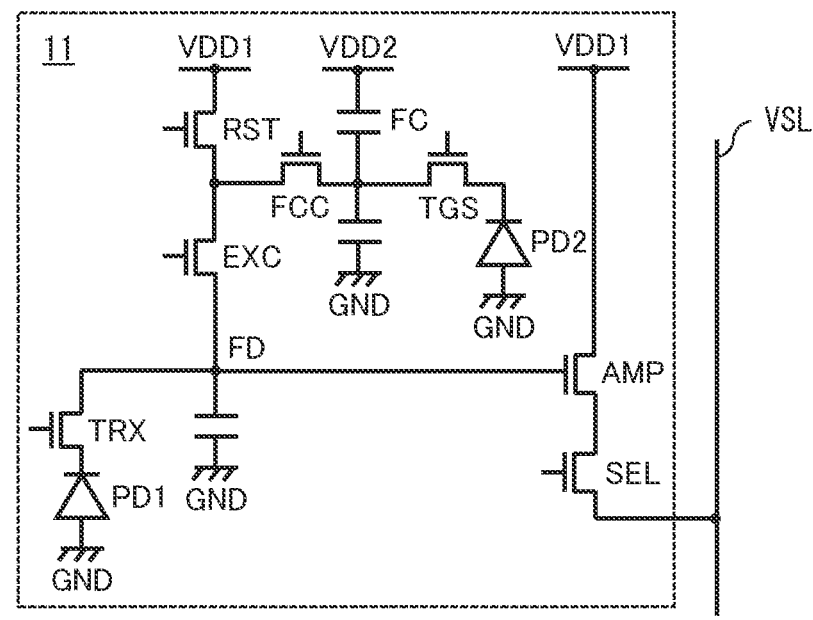
FIG. 13 is a diagram illustrating a modification example of a circuit configuration of the sensor pixel in FIG. 2.

In the embodiment described above and the modification examples thereof, each of the sensor pixels 11 may include a photodiode PD1 in place of the photodiode PD and may further include a photodiode PD2 in addition to the photodiode PD1, for example, as illustrated in FIG. 13. In this case, each of the pixel circuits may include a transfer transistor TGS, an in-pixel capacitor FC, an FC coupling transistor FCC, and a conversion efficiency switching transistor EXC in addition to the transfer transistor TRX, the reset transistor RST, the selection transistor SEL, the amplification transistor AMP, and the floating diffusion FD, for example, as illustrated in FIG. 13.

In the present modification example, each of the pixel circuits generates, for example, a pixel signal based on the electric charge held in the floating diffusion FD and outputs the pixel signal to the vertical signal line VSL. The photodiode PD2 photoelectrically converts light coming through the light receiving surface 11A. The photodiode PD2 performs photoelectric conversion to generate the electric charge corresponding to the amount of received light. The cathode of the photodiode PD2 is electrically coupled to a source of the transfer transistor TGS and the anode of the photodiode PD2 is electrically coupled to a reference potential line (e.g., ground GND).

In the present modification example, the photodiode PD1 may generate a larger total amount of electric charge per unit illuminance in unit time than that of the photodiode PD2. In this case, the photodiode PD1 has higher sensitivity than that of the photodiode PD2 and the photodiode PD2 has lower sensitivity than that of the photodiode PD1.

The transfer transistor TGS is coupled between the photodiode PD2 and a node between the in-pixel capacitor FC and the FC coupling transistor FCC. The transfer transistor TGS moves the electric charge accumulated in the photodiode PD2 to a node between the in-pixel capacitor FC and the FC coupling transistor FCC in accordance with a control signal applied to the gate electrode.

The reset transistor RST has the drain coupled to a power supply line VDD1 and has the source coupled to the drain of the conversion efficiency switching transistor EXC. The reset transistor RST initializes (resets) the floating diffusion FD through the conversion efficiency switching transistor EXC in accordance with a control signal applied to the gate electrode. For example, in a case where the reset transistor RST and the conversion efficiency switching transistor EXC are turned on, the potential of the floating diffusion FD is reset to the potential level of the power supply line VDD1. In other words, the floating diffusion FD is initialized.

The amplification transistor AMP has the gate electrode coupled to the floating diffusion FD, has the drain coupled to the power supply line VDD1, and has the source coupled to the selection transistor SEL. The amplification transistor AMP serves as an input section of a source follower circuit that reads out the electric charge held in the floating diffusion FD. In other words, the amplification transistor AMP has the source coupled to the vertical signal line VSL through the selection transistor SEL, thereby providing the source follower circuit together with a constant current source coupled to an end of the vertical signal line VSL.

The in-pixel capacitor FC is coupled between a node between the FC coupling transistor FCC and the transfer transistor TGS and a power supply line VDD2. The in-pixel capacitor FC accumulates the electric charge transferred (overflowing) from the photodiode PD2.

The FC coupling transistor FCC is coupled a node between the transfer transistor TGS and the in-pixel capacitor FC and a node between the reset transistor RST and the conversion efficiency switching transistor EXC. The FC coupling transistor FCC combines the capacitance potential of the floating diffusion FD and the capacitance potential of the in-pixel capacitor FC with each other in accordance with a control signal applied to the gate electrode.

The conversion efficiency switching transistor EXC is coupled between a node between the reset transistor RST and the FC coupling transistor FCC and the floating diffusion FD. The conversion efficiency switching transistor EXC combines the capacitance potential of the floating diffusion FD and the capacitance potential of the in-pixel capacitor FC with each other in accordance with a control signal applied to the gate electrode.

Figure 14:
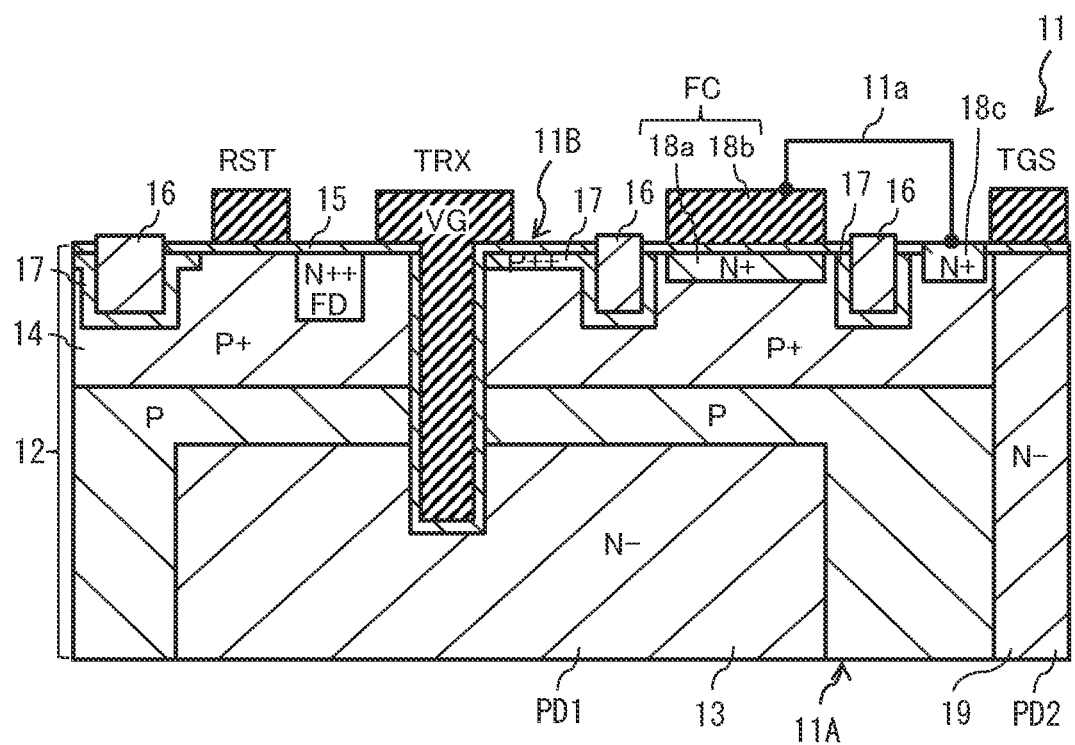
FIG. 14 is a diagram illustrating a modification example of the cross-sectional configuration of the sensor pixel in FIG. 4.

The in-pixel capacitor FC includes a semiconductor region 18a of the second electrical conduction type (e.g., N type) and an electrode 18b disposed to be opposed to the semiconductor region 18a with the insulating film 15 interposed in between, for example, as illustrated in FIG. 14. The semiconductor region 18a is formed in the semiconductor substrate 12. The in-pixel capacitor FC is surrounded by the element separation section 16. The in-pixel capacitor FC is disposed at a position opposed to the vertical gate electrode VG with the element separation section 16 interposed in between. The drain of the transfer transistor TGS includes a semiconductor region 18c, for example, as illustrated in FIG. 14. The semiconductor region 18c is provided adjacent to the in-pixel capacitor FC with the element separation section 16 interposed in between. The semiconductor region 18c is provided as a semiconductor region of the second electrical conduction type (e.g., N type) in the semiconductor substrate 12. A portion of the electric charge accumulated in the photodiode PD is moved to the in-pixel capacitor FC through a metal wiring line 11a electrically coupled to the semiconductor region 18c.

In the present modification example, the in-pixel capacitor FC and the transfer transistor TGS are formed on the upper surface (formation surface 11B) of the semiconductor substrate 12. In this case, the element separation section 16 is provided between the in-pixel capacitor FC and the vertical gate electrode VG or between the in-pixel capacitor FC and the transfer transistor TGS, for example, as illustrated in FIG. 14. This causes the element separation section 16 to electrically separate the in-pixel capacitor FC from the transfer transistor TRX and the transfer transistor TGS. Here, the element separation section 16 is provided near the vertical gate electrode VG, for example, as illustrated in FIG. 14. Even in a case where the element separation section 16 is provided near the vertical gate electrode VG in this way, it is possible to achieve suppressed dark currents and improved transfer characteristics as in the embodiment described above.

3. Application Example

FIG. 15 illustrates an example of a schematic configuration of an imaging system 2 including the solid-state imaging device 1 according to any of the embodiment described above and the modification examples thereof. The imaging system 2 corresponds to a specific example of an "electronic apparatus" according to the present disclosure.

The imaging system 2 is, for example, an electronic apparatus including an imaging device such as a digital still camera or a video camera, a portable terminal apparatus such as a smartphone or a tablet-type terminal, or the like. The imaging system 2 includes, for example, the solid-state imaging device 1 according to any of the embodiment described above and the modification examples thereof, an optical system 31, a shutter device 32, a control circuit 33, a DSP circuit 34, a frame memory 35, a display section 36, a storage section 37, an operation section 38, and a power supply section 39. In the imaging system 2, the solid-state imaging device 1 according to any of the embodiment described above and the modification examples thereof, the shutter device 32, the control circuit 33, the DSP circuit 34, the frame memory 35, the display section 36, the storage section 37, the operation section 38, and the power supply section 39 are coupled to each other through a bus line L.

The optical system 31 includes one or more lenses. The optical system 31 guides light (incident light) from a subject to the solid-state imaging device 1 to form an image on the light receiving surface of the solid-state imaging device 1. The shutter device 32 is disposed between the optical system 31 and the solid-state imaging device 1 and controls a period in which the solid-state imaging device 1 is irradiated with light and a period in which light is blocked under the control of the control circuit 33. The solid-state imaging device 1 accumulates signal charge for a certain period in accordance with light of an image formed on the light receiving surface through the optical system 31 and the shutter device 32. The signal charge accumulated in the solid-state imaging device 1 is transferred to the DSP circuit 34 as a pixel signal (image data) in accordance with a drive signal (timing signal) supplied from the control circuit 33. In other words, the solid-state imaging device 1 receives image light (incident light) coming through the optical system 31 and the shutter device 32 and outputs a pixel signal corresponding to the received image light (incident light) to the DSP circuit 34. The control circuit 33 outputs drive signals for controlling a transfer operation of the solid-state imaging device 1 and a shutter operation of the shutter device 32 and drives the solid-state imaging device 1 and the shutter device 32.

The DSP circuit 34 is a signal processing circuit that processes a pixel signal (image data) outputted from the solid-state imaging device 1. The frame memory 35 temporarily holds the image data processed by the DSP circuit 34 in units of frames. The display section 36 includes, for example, a panel-type display such as a liquid crystal panel or an organic EL (Electro Luminescence) panel and displays a moving image or a still image captured by the solid-state imaging device 1. A storage section 147 records the image data of a moving image or a still image captured by the solid-state imaging device 1 in a recording medium such as a semiconductor memory or a hard disk. The operation section 38 issues operation instructions for a variety of functions of the imaging system 2 in accordance with an operation performed by a user. The power supply section 39 appropriately supplies various kinds of power for operation to the solid-state imaging device 1, the shutter device 32, the control circuit 33, the DSP circuit 34, the frame memory 35, the display section 36, the storage section 37, and the operation section 38 that are supply targets.

Next, an imaging procedure of the imaging system 2 is described.

FIG. 16 illustrates an example of a flowchart of an imaging operation of the imaging system 2. A user issues an instruction to start imaging by operating the operation section 38 (step S101). The operation section 38 then transmits the imaging instruction to the control circuit 33 (Step S102). Upon receiving the imaging instruction, the control circuit 33 starts to control the shutter device 32 and the solid-state imaging device 1. The solid-state imaging device 1 (specifically, the system control circuit 24) executes imaging in a predetermined imaging scheme under the control of the control circuit 33 (step S103). The shutter device 32 controls a period in which the solid-state imaging device 1 is irradiated with light and a period in which light is blocked under the control of the control circuit 33.

The solid-state imaging device 1 outputs image data obtained by imaging to the DSP circuit 34. Here, the image data refers to data for all of the pixels of pixel signals generated on the basis of the electric charge temporarily held in the floating diffusion FD. The DSP circuit 34 performs predetermined signal processing (e.g., noise reduction process or the like) on the basis of the image data inputted from the solid-state imaging device 1 (step S104). The DSP circuit 34 causes the frame memory 35 to hold the image data subjected to the predetermined signal processing and the frame memory 35 causes the storage section 37 to store the image data (step S105). In this manner, imaging is performed by the imaging system 2.

In the present application example, the solid-state imaging device 1 according to any of the embodiment described above and the modification examples thereof is applied to the imaging system 2. This makes it possible to obtain a high-definition image with less noise.

4. Practical Application Examples

Practical Application Example 1

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 17 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 17, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 17, an audio speaker 12061, a display section 12062, and an instrument panel 12063 are illustrated as the output device. The display section 12062 may, for example, include at least one of an on-board display and a head-up display.

FIG. 18 is a diagram depicting an example of the installation position of the imaging section 12031.

In FIG. 18, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 18 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the mobile body control system to which the technology according to the present disclosure may be applied. The technology according to the present disclosure may be applied to the imaging section 12031 among the components described above. Specifically, the solid-state imaging device 1 according to any of the embodiment described above and the modification examples thereof is applicable to the imaging section 12031. The application of the technology according to the present disclosure to the imaging section 12031 makes it possible to provide a mobile body control system in which a high-definition image with less noise is used.

Practical Application Example 2

FIG. 19 is a view depicting an example of a schematic configuration of an endoscopic surgery system to which the technology according to an embodiment of the present disclosure (present technology) can be applied.

In FIG. 19, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 20 is a block diagram depicting an example of a functional configuration of the camera head 11102 and the CCU 11201 depicted in FIG. 19.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above has described the example of the endoscopic surgery system to which the technology according to the present disclosure may be applied. The technology according to the present disclosure may be favorably applied to the image pickup unit 11402 provided to the camera head 11102 of the endoscope 11100 among the components described above. The application of the technology according to the present disclosure to the image pickup unit 11402 allows the image pickup unit 11402 to be smaller in size or higher in definition and it is thus possible to provide the endoscope 11100 in which a high-definition image with less noise is used.

Although the present disclosure has been described above with reference to the embodiment, the modification examples thereof, the application example thereof, and the practical application examples thereof, the present disclosure is not limited to the embodiment and the like described above. A variety of modifications are possible. It is to be noted that the effects described herein are merely illustrative. The effects according to the present disclosure are not limited to the effects described herein. The present disclosure may have effects other than the effects described herein.

In addition, the present disclosure may also have the following configurations.

(1)

A solid-state imaging device including
  a semiconductor substrate including a light receiving surface and a plurality of pixels that is disposed to be opposed to the light receiving surface, in which
  each of the pixels includes
    a photoelectric conversion section that photoelectrically converts light coming through the light receiving surface,
    an electric charge holding section that is formed in a semiconductor region of a first electrical conduction type in the semiconductor substrate as a semiconductor region of a second electrical conduction type different from the first electrical conduction type, the electric charge holding section holding electric charge transferred from the photoelectric conversion section,
    a transfer transistor including a vertical gate electrode and a gate insulating film in contact with the vertical gate electrode, the vertical gate electrode reaching the photoelectric conversion section, the gate insulating film being formed on a surface of the semiconductor substrate opposite to the light receiving surface, the transfer transistor transferring electric charge from the photoelectric conversion section to the electric charge holding section, an element separation section that is formed close to the surface of the semiconductor substrate opposite to the light receiving surface, the element separation section including an oxide film insulator, and a semiconductor layer in contact with a side surface and a bottom surface of the element separation section and the gate insulating film, the semiconductor layer having a higher concentration of impurities of the first electrical conduction type than a concentration of the semiconductor region, at least a portion of the element separation section being disposed apart from the vertical gate electrode with a portion of the semiconductor layer interposed in between, the portion of the semiconductor layer being in contact with the gate insulating film.

(2)

The solid-state imaging device according to (1), in which at least the portion of the element separation section is disposed apart from a portion of the vertical gate electrode other than an upper end section with the portion of the semiconductor layer interposed in between, the portion of the semiconductor layer being in contact with the gate insulating film.

(3)

The solid-state imaging device according to (2), in which at least the portion of the element separation section is disposed apart from the vertical gate electrode as viewed from a normal direction of the semiconductor substrate.

(4)

The solid-state imaging device according to (3), in which any portion of the element separation section is disposed apart from the vertical gate electrode as viewed from the normal direction of the semiconductor substrate.

(5)

The solid-state imaging device according to any one of (1) to (4), in which the semiconductor layer is disposed apart from the vertical gate electrode as viewed from a normal direction of the semiconductor substrate.

(6)

The solid-state imaging device according to any one of (1) to (5), in which a portion of the photoelectric conversion section extends along the vertical gate electrode toward the surface of the semiconductor substrate opposite to the light receiving surface.

(7)

The solid-state imaging device according to any one of (1) to (6), further including an in-pixel capacitor that is disposed at a position opposed to the vertical gate electrode with the element separation section interposed in between, the in-pixel capacitor accumulating the electric charge transferred from the photoelectric conversion section.

(8)

An electronic apparatus including:

a solid-state imaging device that outputs a pixel signal corresponding to incident light; and a signal processing circuit that processes the pixel signal, in which the solid-state imaging device includes a semiconductor substrate including a light receiving surface and a plurality of pixels that is disposed to be opposed to the light receiving surface, each of the pixels including a photoelectric conversion section that photoelectrically converts light coming through the light receiving surface, an electric charge holding section that is formed in a semiconductor region of a first electrical conduction type in the semiconductor substrate as a semiconductor region of a second electrical conduction type different from the first electrical conduction type, the electric charge holding section holding electric charge transferred from the photoelectric conversion section, a transfer transistor including a vertical gate electrode and a gate insulating film in contact with the vertical gate electrode, the vertical gate electrode reaching the photoelectric conversion section, the gate insulating film being formed on a surface of the semiconductor substrate opposite to the light receiving surface, the transfer transistor transferring electric charge from the photoelectric conversion section to the electric charge holding section, an element separation section that is formed close to the surface of the semiconductor substrate opposite to the light receiving surface, the element separation section including an oxide film insulator, and a semiconductor layer in contact with a side surface and a bottom surface of the element separation section and the gate insulating film, the semiconductor layer having a higher concentration of impurities of the first electrical conduction type than a concentration of the semiconductor region, at least a portion of the element separation section being disposed apart from the vertical gate electrode with a portion of the semiconductor layer interposed in between, the portion of the semiconductor layer being in contact with the gate insulating film.

The solid-state imaging device and the electronic apparatus according to the respective embodiments of the present disclosure are each provided with the vertical transistor (transfer transistor TRX) including the vertical gate electrode VG and have at least a portion of the element separation section 16 disposed apart from a portion of the vertical gate electrode VG other than the upper end section (umbrella-shaped portion) with the semiconductor layer 17 interposed in between. This makes it possible to improve the transfer characteristics while suppressing dark currents. It is to be noted that the effects of the present technology are not necessarily limited to the effects described here, but may include any of the effects described herein.

This application claims the priority on the basis of Japanese Patent Application No. 2019-226378 filed on Dec. 16, 2019 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging device, comprising:

a semiconductor substrate including a light receiving surface and a plurality of pixels that is disposed to be opposed to the light receiving surface, wherein each of the pixels includes:

a photoelectric conversion section that photoelectrically converts light coming through the light receiving surface, an electric charge holding section that is formed in a semiconductor region of a first electrical conduction type in the semiconductor substrate as a semiconductor region of a second electrical conduction type different from the first electrical conduction type, the electric charge holding section holding electric charge transferred from the photoelectric conversion section, a transfer transistor including a vertical gate electrode and a gate insulating film in contact with the vertical gate electrode, the vertical gate electrode reaching the photoelectric conversion section, the gate insulating film being formed on a surface of the semiconductor substrate opposite to the light receiving surface, the transfer transistor transferring electric charge from the photoelectric conversion section to the electric charge holding section, an element separation section that is formed close to the surface of the semiconductor substrate opposite to the light receiving surface, the element separation section including an oxide film insulator, a semiconductor layer in contact with a side surface and a bottom surface of the element separation section and the gate insulating film, the semiconductor layer having a higher concentration of impurities of the first electrical conduction type than a concentration of the semiconductor region, and an in-pixel capacitor that is disposed at a position opposed to the vertical gate electrode with the element separation section interposed in between, the in-pixel capacitor accumulating the electric charge transferred from the photoelectric conversion section, wherein at least a portion of the element separation section is disposed apart from the vertical gate electrode with a portion of the semiconductor layer interposed in between, the portion of the semiconductor layer being in contact with the gate insulating film.

2. The solid-state imaging device according to claim 1, wherein at least the portion of the element separation section is disposed apart from a portion of the vertical gate electrode other than an upper end section with the portion of the semiconductor layer interposed in between, the portion of the semiconductor layer being in contact with the gate insulating film.

3. The solid-state imaging device according to claim 2, wherein at least the portion of the element separation section is disposed apart from the vertical gate electrode as viewed from a normal direction of the semiconductor substrate.

4. The solid-state imaging device according to claim 3, wherein any portion of the element separation section is disposed apart from the vertical gate electrode as viewed from the normal direction of the semiconductor substrate.

5. The solid-state imaging device according to claim 1, wherein the semiconductor layer is disposed apart from the vertical gate electrode as viewed from a normal direction of the semiconductor substrate.

6. The solid-state imaging device according to claim 1, wherein a portion of the photoelectric conversion section extends along the vertical gate electrode toward the surface of the semiconductor substrate opposite to the light receiving surface.

7. An electronic apparatus, comprising:
a solid-state imaging device that outputs a pixel signal corresponding to incident light; and
a signal processing circuit that processes the pixel signal,
wherein the solid-state imaging device includes
a semiconductor substrate including a light receiving surface and a plurality of pixels that is disposed to be opposed to the light receiving surface,
each of the pixels including:
a photoelectric conversion section that photoelectrically converts light coming through the light receiving surface,
an electric charge holding section that is formed in a semiconductor region of a first electrical conduction type in the semiconductor substrate as a semiconductor region of a second electrical conduction type different from the first electrical conduction type, the electric charge holding section holding electric charge transferred from the photoelectric conversion section,
a transfer transistor including a vertical gate electrode and a gate insulating film in contact with the vertical gate electrode, the vertical gate electrode reaching the photoelectric conversion section, the gate insulating film being formed on a surface of the semiconductor substrate opposite to the light receiving surface, the transfer transistor transferring electric charge from the photoelectric conversion section to the electric charge holding section,
an element separation section that is formed close to the surface of the semiconductor substrate opposite to the light receiving surface, the element separation section including an oxide film insulator,
a semiconductor layer in contact with a side surface and a bottom surface of the element separation section and the gate insulating film, the semiconductor layer having a higher concentration of impurities of the first electrical conduction type than a concentration of the semiconductor region, and
an in-pixel capacitor that is disposed at a position opposed to the vertical gate electrode with the element separation section interposed in between, the in-pixel capacitor accumulating the electric charge transferred from the photoelectric conversion section,
wherein at least a portion of the element separation section is disposed apart from the vertical gate electrode with a portion of the semiconductor layer interposed in between, the portion of the semiconductor layer being in contact with the gate insulating film.

* * * * *